(12) United States Patent
Chen et al.

(10) Patent No.: US 7,803,521 B2
(45) Date of Patent: Sep. 28, 2010

(54) PHOTORESIST COMPOSITIONS AND PROCESS FOR MULTIPLE EXPOSURES WITH MULTIPLE LAYER PHOTORESIST SYSTEMS

(75) Inventors: Kuang-Jung Chen, Poughkeepsie, NY (US); Wu-Song Huang, Poughkeepsie, NY (US); Wai-Kin Li, Beacon, NY (US); Pushkara R. Varanasi, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 11/942,062

(22) Filed: Nov. 19, 2007

(65) Prior Publication Data

US 2009/0130590 A1   May 21, 2009

(51) Int. Cl.
   *G03F 7/30* (2006.01)
(52) U.S. Cl. .................. 430/330; 430/312; 430/313; 430/316; 430/317; 430/326
(58) Field of Classification Search ................ 430/312, 430/313, 316, 317, 326, 330
   See application file for complete search history.

(56) References Cited

U.S. PATENT DOCUMENTS

| | | | |
|---|---|---|---|
| 5,422,223 A * | 6/1995 | Sachdev et al. ............. 430/190 |
| 5,895,740 A | 4/1999 | Chien et al. |
| 6,635,581 B2 | 10/2003 | Wong |
| 6,692,884 B2 | 2/2004 | Fujimori et al. |
| 7,071,515 B2 | 7/2006 | Sheu et al. |
| 7,132,218 B2 * | 11/2006 | Toishi et al. ............. 430/270.1 |
| 2002/0132189 A1 * | 9/2002 | Huang et al. ................ 430/312 |
| 2002/0187434 A1 * | 12/2002 | Blatchford et al. .......... 430/322 |
| 2003/0180659 A1 * | 9/2003 | Takata et al. ............. 430/270.1 |
| 2003/0215736 A1 | 11/2003 | Oberlander et al. |
| 2004/0069745 A1 * | 4/2004 | Ho et al. ....................... 216/41 |
| 2004/0072094 A1 * | 4/2004 | Shima et al. ............. 430/270.1 |
| 2004/0202954 A1 * | 10/2004 | Momota et al. ............. 430/170 |
| 2006/0160247 A1 | 7/2006 | Koyama et al. |

OTHER PUBLICATIONS

U.S. Appl. No. 11/551,824 Title: High Resolution Imaging Process Using an In-Situ Image Modifying Layer Inventor: Kuang-Jung Chen, et al. Filed: Oct. 23, 2006.

* cited by examiner

*Primary Examiner*—John S Chu
(74) *Attorney, Agent, or Firm*—Schmeiser, Olsen & Watts; Joseph Petrokaitis (57) ABSTRACT

A photoresist composition and methods using the photoresist composition in multiple exposure/multiple layer processes. The photoresist composition includes a polymer comprising repeat units having a hydroxyl moiety; a photoacid generator; and a solvent. The polymer when formed on a substrate is substantially insoluble to the solvent after heating to a temperature of about 150° C. or greater. One method includes forming a first photoresist layer on a substrate, patternwise exposing the first photoresist layer, forming a second non photoresist layer on the substrate and patterned first photoresist layer. Another method includes forming a first photoresist layer on a substrate, patternwise exposing the first photoresist layer, forming a second photoresist layer on the substrate and patterned first photoresist layer and patternwise exposing the second photoresist layer.

27 Claims, 6 Drawing Sheets

PHOTORESIST COMPOSITIONS AND PROCESS FOR MULTIPLE EXPOSURES WITH MULTIPLE LAYER PHOTORESIST SYSTEMS

FIELD OF THE INVENTION

The present invention relates to the field of semiconductor photolithographic fabrication processes; more specifically, it relates to photoresist compositions and methods using these photoresist compositions in multiple exposure/multiple layer photoresist processes.

BACKGROUND OF THE INVENTION

For the semiconductor industry, optical photolithography has been the major technique and continues to be the engine that powers Moore's Law, which states, roughly, the number of transistors per integrated circuit chip doubles every two year. Recently, hyper-numerical aperture (NA) immersion 193 nm lithography has replaced 157 nm for 32 nm groundrule technology and pushed enhanced-ultraviolet (EUV) photolithography further to 22 nm groundrule technology. Many resolution enhancement technology (RET) methods have also contributed to the extension of optical photolithography to print very low k1 images. The value of k1 can be found using the optical projection lithography resolution equation W=k1λ/NA, where W is the minimum printable feature size, λ is the exposure wavelength (e.g. 193 nm, 157 nm), NA is the numerical aperture of the lithography system and k1 is a lithographic constant of the system.

Currently, double exposure (DE) has emerged to a method to reduce k1 in the fabrication of integrated circuit chips. Several double exposure schemes have been developed. A first DE scheme is called is double dipole lithography (DDL). In DDL X-axis critical images placed on a first mask and Y-axis critical images are placed on a second photomask. A layer of photoresist is exposed through the first mask with an X dipole and then the layer of photoresist is exposed through the second mask using a Y dipole. A second DE scheme is double exposure double etch ($DE^2$). In $DE^2$, a first layer of photoresist is exposed through a first mask and images etched into a substrate (or an underlying layer). The first photoresist layer is then removed. A second layer of photoresist is exposed through a second mask and images etched into the substrate (or the underlying layer). The second photoresist layer is then removed.

Both these techniques however, suffer from distortions introduced into the photoresist patterns. Accordingly, there exists a need in the art to overcome the deficiencies and limitations described hereinabove.

SUMMARY OF THE INVENTION

A first aspect of the present invention is a positive tone photoresist composition, comprising: a polymer comprising repeat units having a hydroxyl moiety, a photoacid generator, and a solvent, the polymer having the property of being substantially soluble in the solvent and becoming substantially insoluble in the solvent after heating the polymer to a temperature of about 150° C. or greater.

A second aspect of the present invention is a method of forming patterned structure, the method comprising: (a) dispensing a photoresist formulation over a substrate or a fabrication layer formed on the substrate, the photoresist formulation comprising a solvent a polymer and a photoacid generator, the polymer having the property of being substantially soluble in the solvent and becoming substantially insoluble in the solvent after heating the polymer to a temperature of about 150° C. or greater, and removing the solvent to form a photoresist layer; (b) patternwise exposing the photoresist layer to actinic radiation to form an exposed photoresist layer; (c) placing the exposed photoresist layer in an aqueous base solution to selectively remove regions of the photoresist layer exposed to the actinic radiation to form a patterned photoresist layer; (d) heating the patterned photoresist layer at a temperature of about 150° C. or greater; (e) forming a non photoresist layer over the patterned photoresist layer and regions of the substrate or the fabrication layer where the substrate or layer is not covered by the patterned photoresist layer, the non photoresist layer comprising a second polymer.

A third aspect of the present invention is a method of forming patterned structure, the method comprising: (a) dispensing a first photoresist formulation over a substrate or a fabrication layer formed on the substrate, the first photoresist formulation comprising a solvent a polymer and a photoacid generator, the polymer having the property of being substantially soluble in the solvent and becoming substantially insoluble in the solvent after heating the polymer to a temperature of about 150° C. or greater, and removing the casting solvent to form a photoresist layer; (b) patternwise exposing the first photoresist layer to first actinic radiation to form a first exposed photoresist layer; (c) placing the first exposed photoresist layer in a first aqueous base solution to selectively remove regions of the first photoresist layer exposed to the first actinic radiation to form a first patterned photoresist layer; (d) heating the photoresist layer to a temperature about 150° C. or greater; (e) dispensing a second photoresist formulation over the patterned first photoresist layer, the second photoresist formulation comprising the solvent, a second polymer and a second photoacid generator, and removing the solvent to form a second photoresist layer comprising the second polymer and the second photoacid generator; (f) patternwise exposing the second photoresist layer to second actinic radiation to form a second exposed photoresist layer; and (g) placing the second exposed photoresist layer in a second aqueous base solution to selectively remove regions of the second exposed photoresist layer exposed to the second actinic radiation to form a second patterned photoresist layer.

BRIEF DESCRIPTION OF THE DRAWINGS

The features of the invention are set forth in the appended claims. The invention itself, however, will be best understood by reference to the following detailed description of an illustrative embodiment when read in conjunction with the accompanying drawings, wherein:

FIGS. 2A, 3A, 4A and 5A are top views

FIGS. 11A, 12A, 13A and 14A are top views

DETAILED DESCRIPTION OF THE INVENTION

Chemically amplified photoresist compositions include a polymer, a solvent and a photoacid generator. The polymer is substantially soluble in the solvent and substantially insoluble in aqueous base solutions. A photoresist layer is formed by driving out the solvent. Exposure of the photoacid generator in the layer to actinic radiation causes release of an acid or changes the chemical structure of the photoacid generator so it releases acid upon exposure to heat. In regions of the photoresist layer where this acid is released the polymer is rendered substantially soluble in aqueous base solutions (i.e., pH greater than about 7), but in regions of the photoresist layer where no acid is present, the polymer remains substantially insoluble in aqueous base developer.

Almost all materials are soluble to some degree and there are very few materials that are 100% insoluble in a particular solvent or solution. In the context of image development polymers, the term substantially insoluble is intended to include polymers having such a small degree of solubility in an aqueous base solution so as to not effect the quality of the image formed from the polymer by loss of polymer by dissolution into aqueous base solution from regions of the photoresist layer not containing photo acid generator derived acid. In the context of image development, the term substantially soluble is intended to include polymers having a high enough degree of solubility in aqueous base solutions so to allow all or almost all (i.e., any remaining polymer is present such a small amounts so as to not interfere with subsequent processing steps) of the polymer in regions containing acid derived from the photoacid generator to dissolve into aqueous base solutions. In the context of photoresist formulation and semiconductor processing the term substantially soluble is intended to include polymers completely or almost completely soluble in photoresist solvents. (examples of solvents given infra). Further to be considered substantially soluble, dissolution must take a reasonable amount of time and occur within seconds or minutes at most. In the context of photoresist formulation and semiconductor processing the term substantially insoluble is intended to include polymers completely or almost completely insoluble in photoresist solvents. Substantially insoluble polymers have a dissolution rate of less than about 0.2 nm/s in solvent or aqueous base substantially soluble polymers have a dissolution rate of greater than about 5 nm/s in solvent or aqueous base. In general, the polymer dissolution rates effect the dissolution rates of the photoresist layers most strongly. Photoacid generators, quencher and other additives will also alter the dissolution rates of the final photoresist layer.

The embodiments of the present invention utilize a system where a first pattern is formed in a first photoresist layer by exposure through a block mask having relatively large size images. Then a second layer of photoresist is applied over the first photoresist layer and a second pattern form in the second photoresist layer by exposure through a second mask having a dense pattern of images. Then the combined patterns are transferred into a substrate (or an underlying layer) and both photoresist layers removed.

Requirements of this two photoresist scheme include: (1) no intermixing between the two photoresist layers, (2) images can be printed independently, (3) no substantial distortion of the resist images of each resist layers in the bake and develop processes and (4) and each resist layer needs to meet image resolution specifications for the particular fabrication level.

Figure 1:
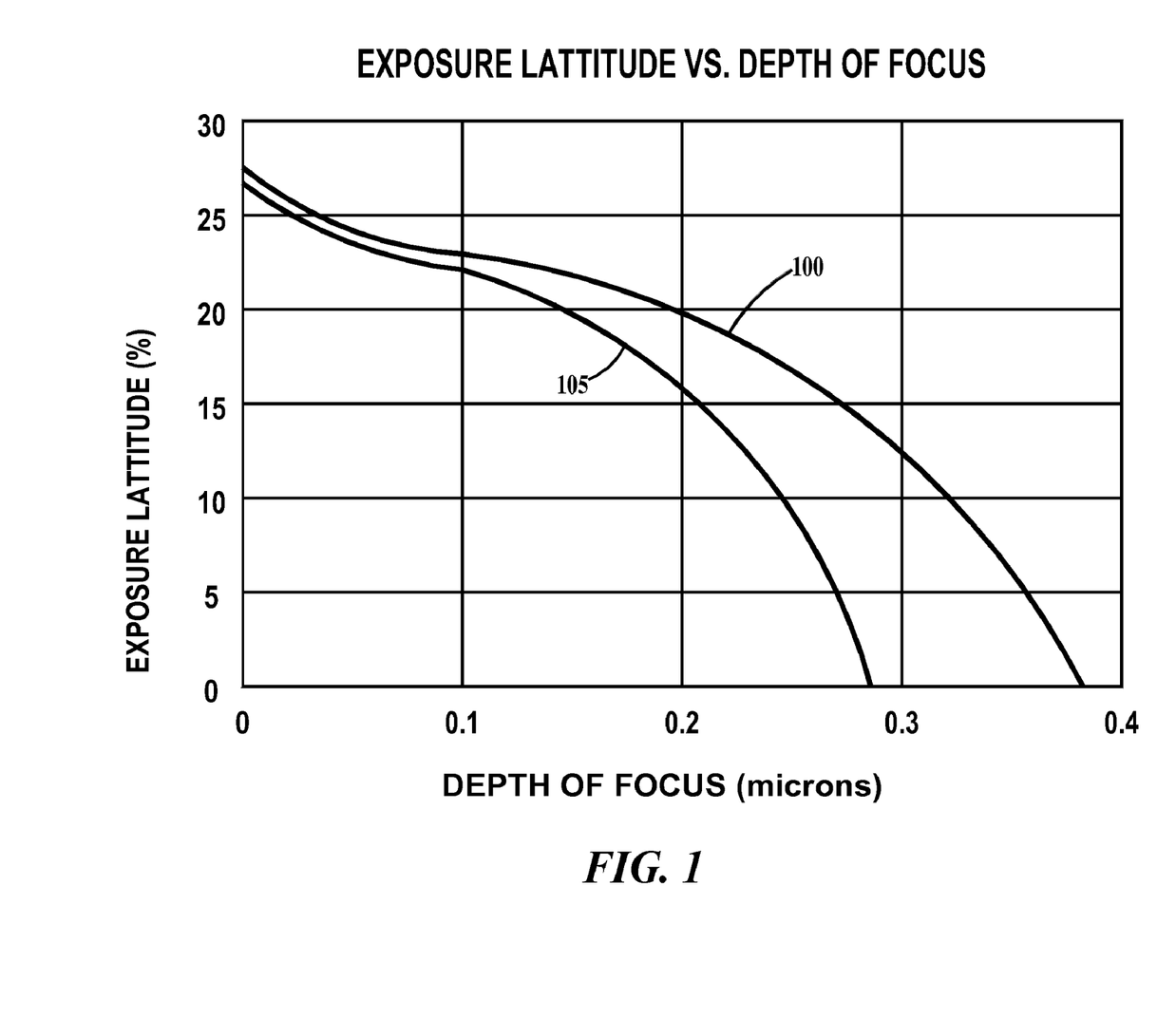
FIG. 1 is a plot of exposure latitude and depth of focus (i.e. process window) for printing dense and isolated contact openings.
Figure 2A:
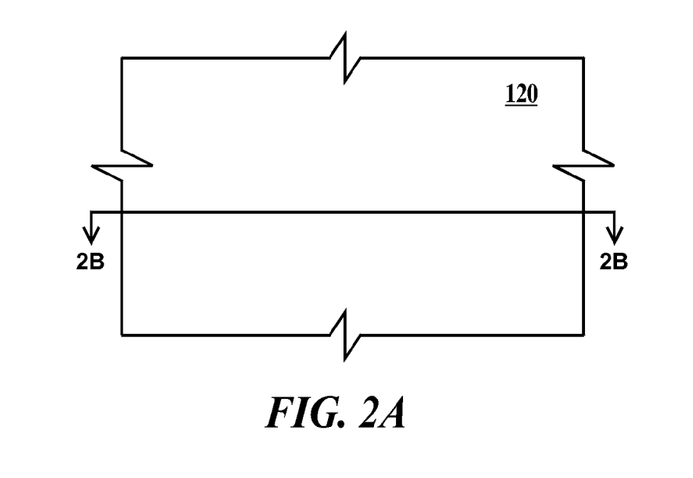
Figure 2B:
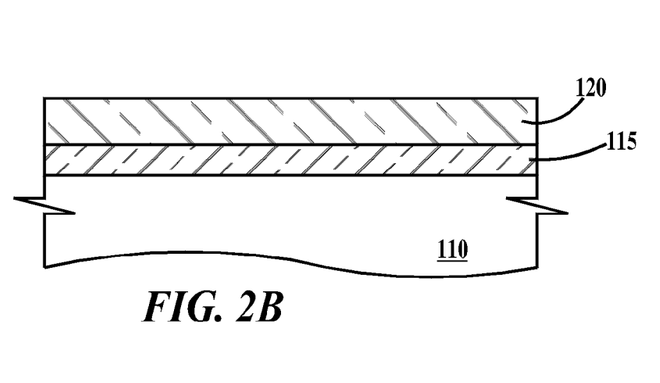
FIGS. 2B, 3B, 4B and 5B are corresponding cross-sectional views illustrating a first method of photolithography according to an embodiment of the present invention.

FIG. 1 is a plot of exposure latitude and depth of focus (i.e. process window) for printing high and low density arrays of contact openings. In FIG. 1, curve 100 represents measurement data obtained by measuring the width of circular images, printed in a positive photoresist layer, having a nominal diameter of N nm and spaced 2N nm apart on center in both the X and Y directions. Curve 105 represents measurement data obtained by measuring the width of circular images, printed in a positive photoresist layer, having a nominal diameter of N nm and spaced 6N nm apart on center in both the X and Y directions. N is a positive number greater than zero. Thus the image density of curve 100 is 4 times that of curve 105. Curves 100 and 105 indicate that there is more process latitude in printing a dense array of images than in printing a pattern of isolated images. Process latitude is a description of how far away from a nominal set-point a process can be (e.g., exposure time and intensity, develop time and temperature) and still have a dimension of a printed image be within a specification limit.

FIGS. 2A, 3A, 4A and 5A are top views and FIGS. 2B, 3B, 4B and 5B are corresponding cross-sectional views illustrating a first method of photolithography according to an embodiment of the present invention. In FIGS. A and 2B, formed on a substrate 110 is an optional and exemplary dielectric layer 115. Formed on a top surface of dielectric layer 115 is a first photoresist layer 120. In one example, first photoresist layer 120 is formed by spin applying a positive, chemically amplified first photoresist composition comprising a polymer, photoacid generator and a solvent followed by heating (in a pre-exposure bake) to a temperature above room temperature (e.g., between about 80° C. and about 150° C.) to drive out the solvent but not otherwise affect the polymer or photoacid generator. In one example, first photoresist layer 120 is between about 30 nm to about 500 nm thick. Alternatively, first photoresist layer 120 may be formed on a top surface of a bottom antireflective coating (BARC) formed on the top surface of dielectric layer 115 and/or a top antireflective coating (TARC) may be formed on a top surface of first photoresist layer 120. TARCs are advantageously substantially soluble in aqueous base solutions.

Figure 3A:
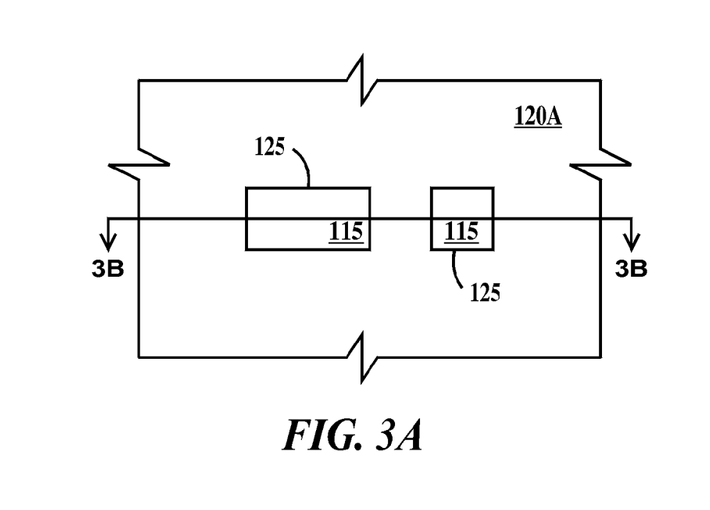
Figure 3B:
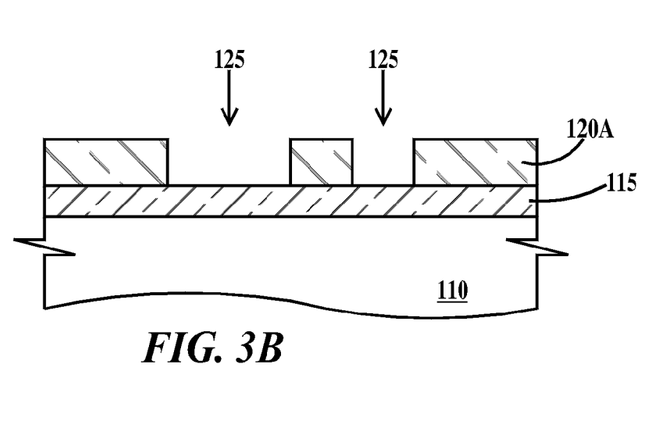

In FIGS. 3A and 3B, a first photolithography process is performed to form openings 125 in first photoresist layer 120 (see FIG. 2B) to form a first patterned photoresist layer 120A. A typical photolithography process includes (1) exposing a photoresist layer to actinic radiation through a patterned photomask, (2) optionally heating (in a pre-develop bake) the exposed layer to a temperature above room temperature (e.g., between about 30° C. and about 150° C.) to further acid generation by the photoacid generator but not cause crosslinking of the polymer and (3) developing the exposed layer in aqueous base developer (e.g., an aqueous solution of tetramethyl ammonium hydroxide (TMAH)) which removes those regions of the photoresist layer exposed to the actinic radiation.

A post-develop bake is next performed in which first patterned photoresist layer 120A is heated to a temperature above room temperature (e.g., between about 150° C. and about 230° C.) to switch patterned photoresist layer 120A from soluble to substantially insoluble in its own casting solvent. The polymer of the first photoresist composition comprises repeat units having a hydroxyl group. At the elevated temperature of the post-develop bake, the hydroxyl moiety in the first polymer facilitates the reduction of the dissolution rate of the first resist to its own casting solvent. Detectable cross-linking between polymer chains has been observed in Fourier transfer infrared (FTIR) and gel permeation chromatography (GPC) studies when the first photoresist layer was baked at an elevated temperature of about 200° C. or higher. The chemical composition of the first photoresist composition is described in more detail infra. The post-develop bake renders first patterned photoresist layer 120A substantially insoluble in aqueous base developer and in a second positive photoresist composition used to form second photoresist layer 130 in FIGS. 4A and 4B.

Figure 4A:
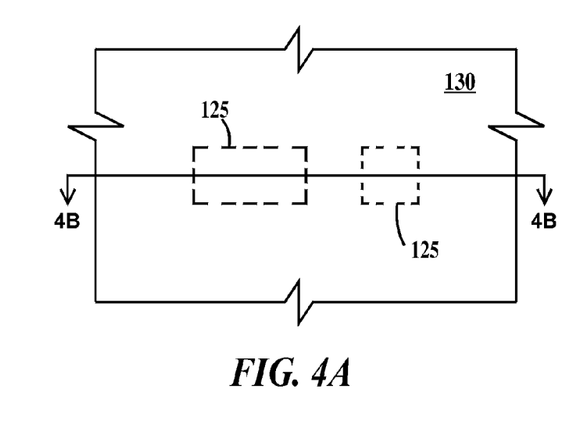
Figure 4B:
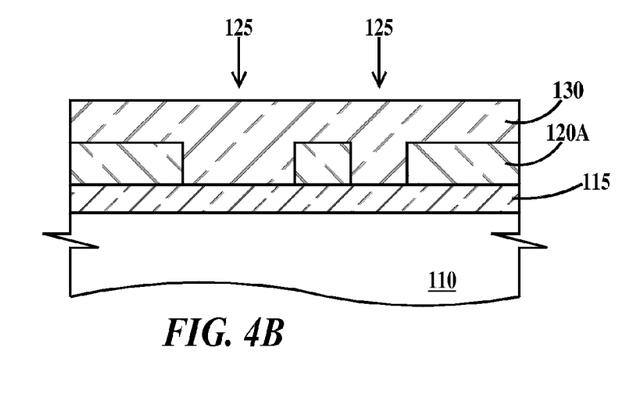

In FIGS. 4A and 4B, second photoresist layer 130 is formed on patterned photoresist layer 120A and exposed regions of dielectric layer 115. In one example, second photoresist layer 130 is formed by spin applying a positive, chemically amplified second photoresist composition comprising a polymer, photoacid generator and a solvent followed by heating (in a pre-exposure bake) to a temperature above room temperature (e.g., between about 80° C. and about 150° C.) to drive out the solvent. In one example, second photoresist layer 130 is between about 30 nm to about 500 nm thick. Alternatively, a BARC may be first formed and second photoresist layer 130 formed on the BARC and/or a top TARC may be formed on a top surface of second photoresist layer 130. To prevent the second exposure from rendering the first patterned photo resist layer substantially soluble in the aqueous base developer, it is preferred that second photoresist layer 130 have higher sensitivity to actinic radiation than that first photoresist layer 120 (see FIGS. 2A and 2B) has to the same actinic radiation. The lower dose engineered in the second photo resist layer will prevent the second exposure to cause significant deprotection of the first polymer during second post-exposure bake. The first polymer and second polymer can be the same or different. The dose differential can be easily achieved with different amount of photoacid generator (PAG) and/or different quencher loadings.

Figure 5A:
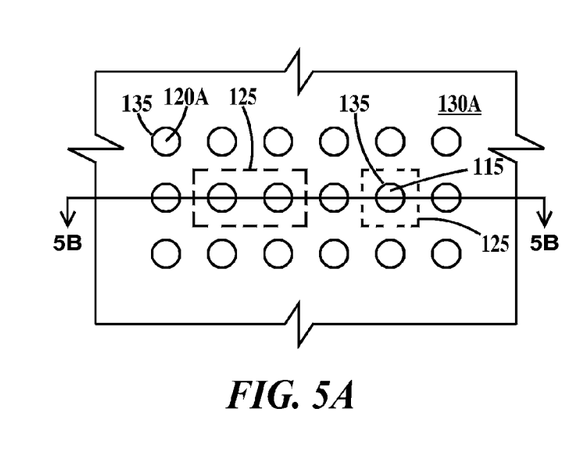
Figure 5B:
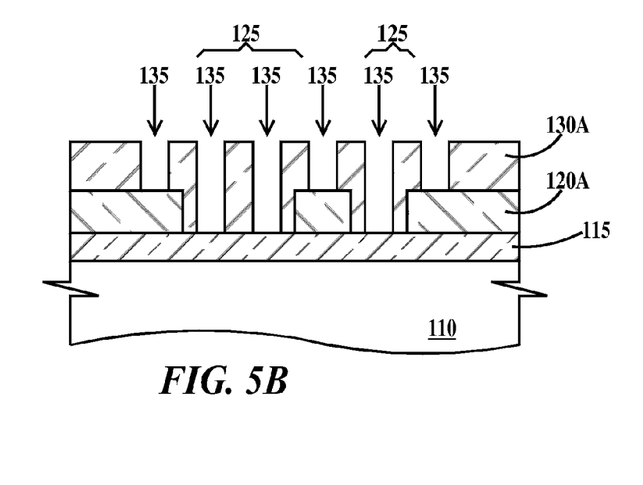

In FIGS. 5A and 5B, a second photolithography process is performed to form openings 135 in second photoresist layer 130 (see FIG. 4B) to form a second patterned photoresist layer 130A. An optional pre-develop bake (e.g., between about 30° C. and about 150° C.) may be performed to activate acid generating moieties but image distortion in first patterned photoresist layer 120A. In FIGS. 5A and 5B, it can be seen that a first set of openings 135 are formed over first patterned photoresist layer 120A and a second set of openings 135 are formed in opening 125 of first patterned photoresist layer 120A, exposing regions of dielectric layer 115 in the bottoms of openings 135 of the second set. Curve 100 of FIG. 1 represents the process window of the second photolithographic process.

As an alternative to forming second photoresist layer 130 in FIGS. 4A and 4B, substantially insoluble photoresist layer 120A and openings 125 of FIGS. 3A and 3B can be used as a template for self assembled second layer, to enhance etch selectivity, to alter reflectivity and to change chemical properties. The second coated layer can be a non-photoresist layer. Typical examples of self-assembly polymers such as methylmethacrylate and styrene di-block copolymers can be spin coated on top of the formed patterned structures as shown in FIG. 3B. The di-block copolymers can then subject to heat annealing or solvent annealing to form self-assembly structures such as 20 nm lines and spaces and 20 nm contact holes. High silicon content polymers such as silsesquioxane polymers can be coated on top of the formed patterned resist structures to provide differential etch selectivity in a multilayer structure. Antireflective coating material can also be coated on top of the formed patterned resist structures to reduce reflectivity of a multilayer structure In FIGS. 3A and 3B and 5A and 5B, different polymers with different chemical properties may also be coated on top of the formed patterned resist layers 120A and 130A to provide different chemical properties such as: changing hydrophobic or hydrophilic surface, changing acidity or causticity, and changing resistance to certain chemicals.

Figure 6:
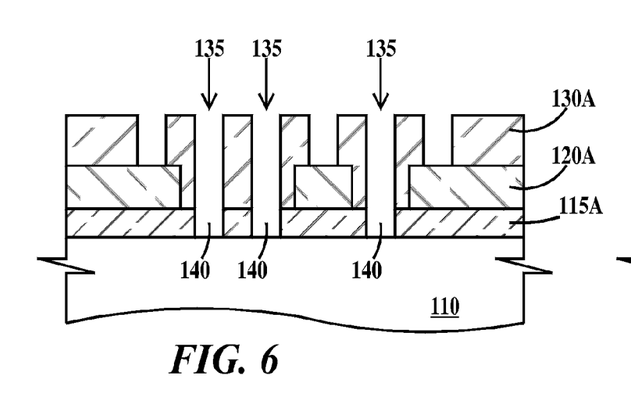
FIGS. 6, 7 and 8 are cross-sectional views of a first fabrication process continuing from FIGS. 5A and 5B.
Figure 7:
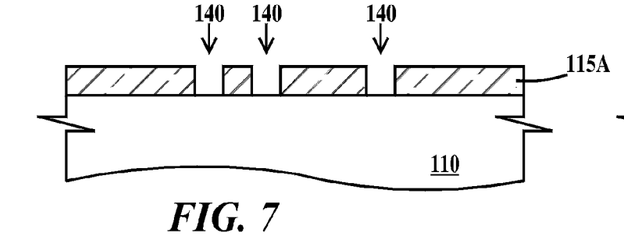
Figure 8:
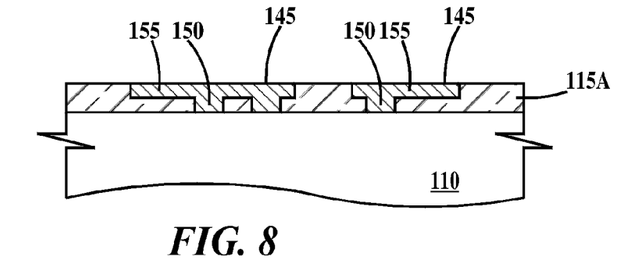

FIGS. 6, 7 and 8 are cross-sectional views of a first fabrication process continuing from FIGS. 5A and 5B. In FIG. 6, dielectric layer 115 (see FIG. 5B) is etched (e.g., by reactive ion etch (RIE)) using first and second patterned photoresist layers 120A and 130A as etch masks to form openings 140 in dielectric layer 115A.

In FIG. 7, first and second patterned photoresist layers 120A and 130A (see FIG. 6) are removed. At this point any number of fabrication processes may be performed. In one example a damascene process is performed to fill openings 140 with an electrical conductor forming electrically conductive vias or contacts. A damascene process is one in which trenches or openings are formed in a dielectric layer, an electrical conductor of sufficient thickness to fill the trenches or openings is deposited on a top surface of the dielectric, and a chemical-mechanical-polish (CMP) process is performed to remove excess conductor and make the surface of the conductor co-planar with the surface of the dielectric layer to form damascene wires (or damascene vias or contacts).

In FIG. 8, a dual-damascene process has been performed to form wires 145 having via portions 150 and integral wire portions 155. A dual-damascene process is one in which via openings are formed through the entire thickness of a dielectric layer followed by formation of trenches part of the way through the dielectric layer in any given cross-sectional view. An electrical conductor of sufficient thickness to fill the trenches and via opening is deposited on a top surface of the dielectric and a CMP process is performed to make the surface of the conductor in the trench co-planar with the surface the dielectric layer to form dual-damascene wires and dual-damascene wires having integral dual-damascene vias.

Figure 9:
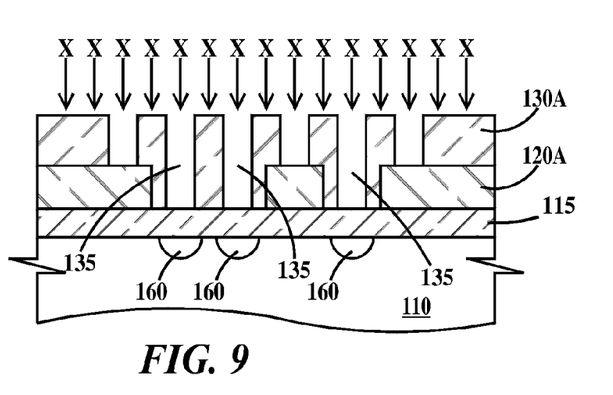
FIGS. 9 and 10 are cross-sectional views of a second fabrication process continuing from FIGS. 5A and 5B.
Figure 10:
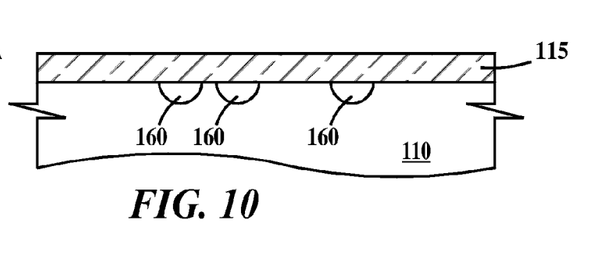

FIGS. 9 and 10 are cross-sectional views of a second fabrication process continuing from FIGS. 5A and 5B. In FIG. 9 an ion implantation of dopant species X is performed to form doped regions 160 in substrate 110 where the substrate is not protected by first and second patterned photoresist layers 120A and 130A. In FIG. 10, first and second patterned photoresist layers 120A and 130A are removed. Subsequently, dielectric layer 115 may be removed and replaced with another layer.

Figure 11A:
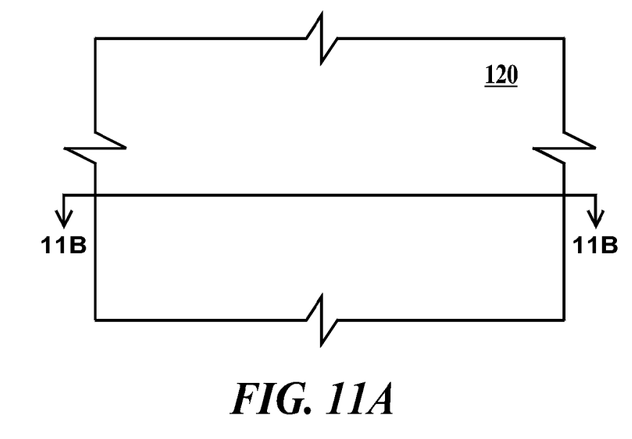
Figure 11B:
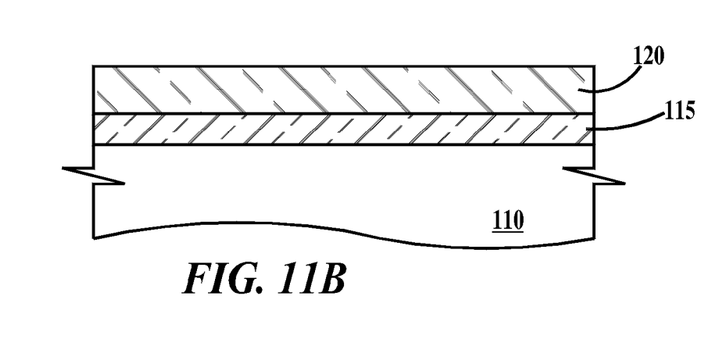
FIGS. 11B, 12B, 13B and 14B are corresponding cross-sectional views illustrating a second method of photolithography according to an embodiment of the present invention.
Figure 12A:
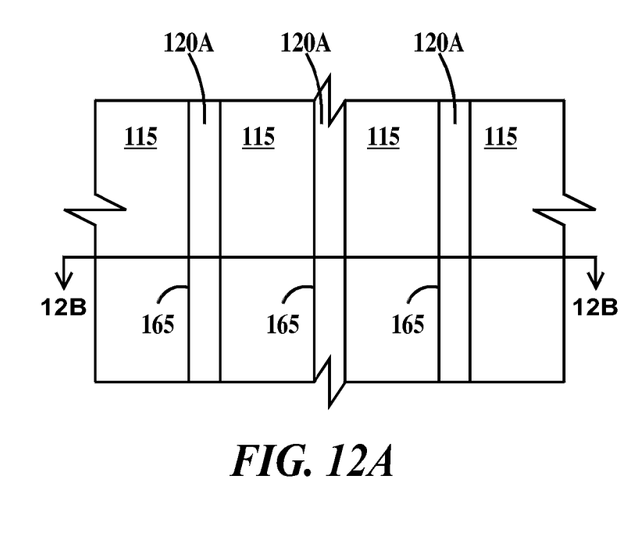
Figure 12B:
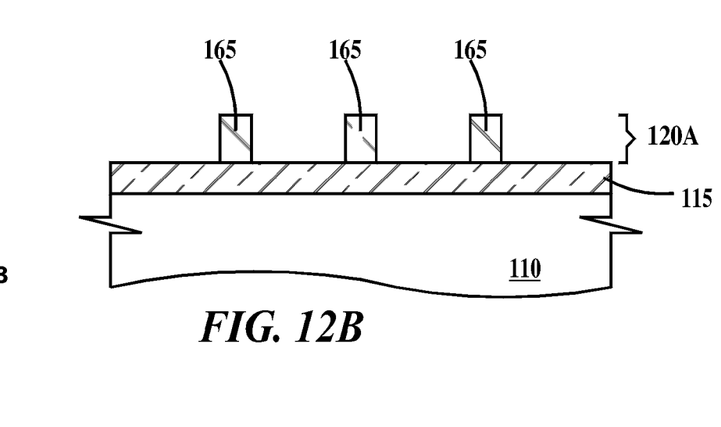
Figure 13A:
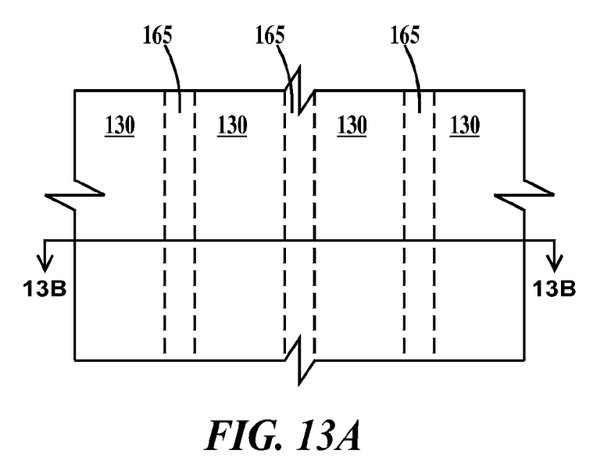
Figure 13B:
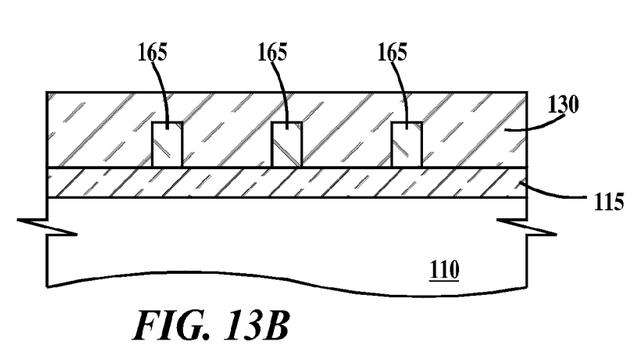

FIGS. 11A, 12A, 13A and 14A are top views and FIGS. 11B, 12B, 13B and 14B are corresponding cross-sectional views illustrating a second method of photolithography according to an embodiment of the present invention. FIGS. 11A and 11B are identical to FIGS. 2A and 2B. FIGS. 12A and 12B are similar to FIGS. 3A and 3B except instead of openings, first photoresist bars 165 are formed from first photoresist layer 120 (see FIG. 11B). First photoresist bars 165 have been post-exposure baked or heat cured (e.g., heated to between about 150° C. and about 230° C.) to switch patterned photoresist layer 120B from soluble to substantially insoluble in its own casting solvent. FIGS. 13A and 13B are similar to FIGS. 4A and 4B in that second photoresist layer 130 is formed over first photoresist bars 165 and regions of dielectric layer 115 not covered by first photoresist bars 165.

Figure 14A:
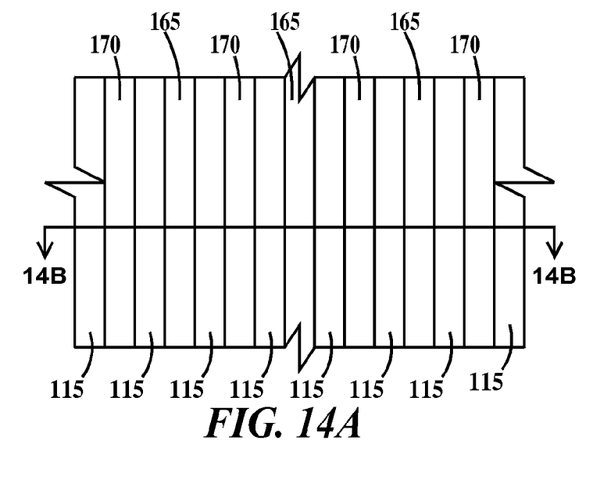
Figure 14B:
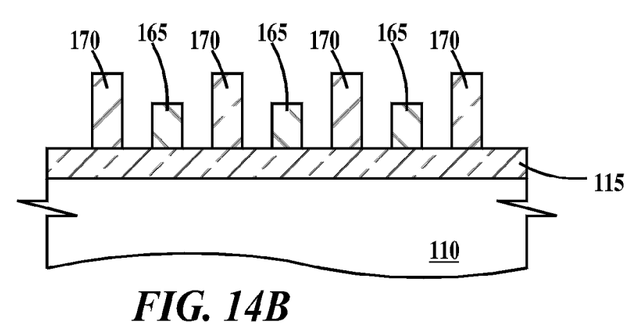

In FIGS. 14A and 14B, a second photolithography process similar to that described supra in reference to FIGS. 5A and 5B is performed to form second photoresist bars 170 from second photoresist layer 130 (see FIG. 13B). In FIGS. 14A and 14B, it can be seen that first and second photoresist bars 165 and 170 alternate with regions of dielectric layer 115 exposed between the first and second bars. Additional process steps, such as those described supra may be performed. The second fabrication process may be advantageously used to form wire portions 155 of dual damascene wires 145 of FIG. 8 or to form single damascene wires or to form gates of field effect transistors to give a few examples.

The photoresist composition used to form layer 120 of FIGS. 2A, 2B, 11A and 11B includes (1) a copolymer, a terpolymer or a tetrapolymer, (2) a photoacid generator, and (3) a solvent. The photoresist composition may optionally further include one or more of (4) a quencher and (5) a surfactant. It is advantageous that that the photoacid generator be an iodonium salt. The copolymers of the present invention comprise repeat units containing a hydroxyl moiety and repeat units containing a tertiary ester moiety. The terpolymer of the present invention comprises repeat units containing a hydroxyl moiety, repeat units containing a tertiary ester moiety and repeat units containing a lactone moiety. The tetrapolymer of the present invention comprises repeat units containing a hydroxyl moiety, repeat units containing a tertiary ester moiety, repeat units containing a lactone moiety and repeat units containing an additional solubility promoting moiety including those containing fluorine atoms.

Examples of hydroxyl moieties include primary, secondary and tertiary alcohols, and hydroxyl moieties attached to polycyclic structures.

Examples of tertiary ester moieties include those that can be deprotected by acid generated by the photoacid generator. Examples of tertiary ester moieties are those containing methyladamantane, ethyladamantane, methylcyclopentane, ethylcyclopentane, methylcyohexane, ethylcyclohexane, methylcycloheptane, ethylcyclohepatane, methylcyclooctane, ethylcyclooctane, and t-butyl groups.

Lactone moieties improve dissolution in aqueous developer. Examples of lactones moieties include 5-methacryloyloxy-2,6-norbornanecarbo-γ-lactone, 3-methacryloyloxymethyl-2,6-norbornanecarbo lactone, 3-acryloyloxymethyl-2,6-norbornanecarbo lactone, α-acryloyloxy-γ-butyrolactone, α-methacryloyloxy-γ-butyrolactone, β-acryloyloxy-γ-butyrolactone and β-methacryloyloxy-γ-butyrolactone.

Examples of solubility promoting moieties include sulfonamides, fluorinated sulfonamides, fluoroalcohols (e.g., moieties having both —OH and —CF$_3$ groups), dicarboxyimides, N-hydroxy dicarboxyimides, phenol, amino and imino groups.

In one example, the copolymers, terpolymers and tetrapolymers of the present invention preferably have ethylenic backbones. In one example, the copolymers, terpolymers and tetrapolymers of the present invention are preferably formed from vinyl, acrylate and/or methacrylate monomeric units. In one example, the backbone of the copolymers, terpolymers and tetrapolymers of the present invention do not contain unsaturated carbon-to-carbon bonds.

Photoresist polymers used in the photoresist compositions of the embodiments of the present invention will not flow under post-development bake conditions as photoresist flow would distort the images. Copolymers, terpolymers and tetrapolymers of the embodiments of the present invention advantageously have Tg greater than about 160° C. Low Tg polymers usually cause deprotection to occur during post-development bake, rendering the polymer substantially soluble in aqueous base developer. Since some acrylate polymers have lower Tg than methacrylate polymers, methacrylate polymers are preferred. Acrylate polymers may be used, but the post-development bake temperatures must be lowered to compensate for the low Tg of acrylate polymers or high Tg acrylate polymers need to be used.

Terpolymers and tetrapolymers are preferred over copolymers for polymers in the photoresist compositions according to the embodiments of the present invention. Photoresists formulated with terpolymers and tetrapolymers usually give better lithographic performance such as higher resolution, larger process window and more stable images (less likely to collapse) than those with copolymers. However, blending of different copolymers may create compositions containing the same amount of those repeat units in the terpolymers, which would then give lithographic performance comparable to those of terpolymers and tetrapolymers. Similarly, blending of different terpolymers could create similar compositions to tetrapolymers, and thus render the formulated photoresist perform lithographically comparable to those formulated with tetrapolymers.

Specific examples of repeat units containing hydroxyl moieties include:

Specific examples of repeat units containing tertiary ester moiety moieties include:

Specific examples of repeat units containing lactone moieties include:

Specific examples of repeat units containing solubility enhancing moieties include:

In one example, a terpolymer according to the present invention comprises the following repeat units:

Examples of photoacid generators include, but are not limited to, onium salts, iodonium salts, sulfonium salts, succinimide derivatives, 4-(1-butoxynaphthyl)tetrahydrothiophenium perfluorobutanesulfonate, triphenyl sulfonium perfluorobutanesulfonate, t-butylphenyl diphenyl sulfonium perfluorobutanesulfonate, 4-(1-butoxynaphthyl)tetrahydrothiophenium perfluorooctanesulfonate, triphenyl sulfonium perfluorooctanesulfonate, t-butylphenyl diphenyl sulfonium perfluorooctanesulfonate, di(t-butylphenyl) iodonium perfluorobutane sulfonate, di(t-butylphenyl) iodonium perfluorohexane sulfonate, di(t-butylphenyl) iodonium perfluoroethylcyclohexane sulfonate, di(t-butylphenyl)iodonium camphoresulfonate, and perfluorobutylsulfonyloxybicylo[2.2.1]-hept-5-ene-2,3-dicarboximide. Any of these photoacid generators may be used singly or in a mixture of two or more. It is advantageous that the photoacid generator release an acid having at least 4 carbon atoms to minimize acid diffusion, as acid diffusion can adversely affect image size control.

The specific photoacid generator selected will depend on the irradiation wavelength being used for patterning the photoresist. Photoacid generators are currently available for a variety of different wavelengths of light from the visible range to the X-ray range; thus, imaging of the photoresist can be performed using deep-UV, extreme-UV, e-beam, laser, or any other selected irradiation source that is deemed useful.

Example of solvents include, but are not limited to, ethers, glycol ethers, aromatic hydrocarbons, ketones, esters, propylene glycol monomethyl ether acetate, ethyl lactate, γ-butyrolactone, and cyclohexanone. Any of these solvents may be used singly or in a mixture of two or more.

Quenchers are generally weakly ionized bases (i.e., $pK_b < 13$). Examples of quenchers include, but are not limited to, aromatic amines, aliphatic amines, 2-phenylbenzimidazole, t-alkyl ammonium hydroxides and t-butyl ammonium hydroxide (TBAH).

Examples of surfactants include, but are not limited to fluorine-containing surfactants, such as 3M's FC-4430™ and siloxane-containing surfactants such as Union Carbide's SIL-WET™ series.

The photoresist compositions of the invention comprise (1) about 1 wt % to about 30 wt %, preferably about 2 wt % to about 15 wt % of copolymer, terpolymer or tetrapolymer based on the total weight of the composition, (2) about 0.5 wt % to about 20 wt %, preferably about 0.5 wt % to about 10 wt % of photoacid generator based on the weight of the polymer in the composition, and (3) about 70 wt % to about 99 wt. %, preferably about 85 wt % to about 98 wt % solvent based on the total weight of the composition. The photoresist composition may further include about 0.1 wt % to about 1.0 wt % of quencher based on the total weight of the polymer. The photoresist composition may further include about 0.001 wt % to about 0.1 wt % of surfactant based on the total weight of polymer in the composition.

PREPARATION EXAMPLES

Example 1

Layer Loss Test with its Own Casting Solvent of Photoresist Formulation A after Various Post-Exposure Bake Temperatures A terpolymer consisting of 44 mole % 2-methyl-2-adamantyl methacrylate (MadMA), 31 mole % 3-hydroxy-1-adamantylmethacrylate (HAdMA) and 25 mole % 5-methacryloyloxy-2,6-norbornanecarbolactone (NLM) was dissolved in propylene glycol monomethyl ether acetate (PGMEA) with 30 wt % γ-butyrolactone (GBL), 7 wt % di(t- butylphenyl)iodonium perfluorobutane sulfonate (BPI—N) and 0.74 wt % of tert-butyl 2-phenyl-1,3-benzodiazole-1-carboxylate (all wt % relative to polymer) to make photoresist formulation A with 6.6 wt % of solid content. The photoresist formulation was filtered through a 0.2 μm filter. The photoresist formulation was spin coated on a 5" silicon wafer. The resultant photoresist layer was post-apply baked at 140° C. for 60 seconds. The thickness of the photoresist layer was then measured with a NanoSpec 8000 Layer Thickness Analyzer from Nanometrics Incorporated. The casting solvent was dispensed on the above mentioned wafer and spun at 1500 rpm for 60 s, then baked at 130° C. for 60 seconds. The photoresist layer thickness was then measured again with a Nanospec 8000 Layer Thickness Analyzer. The photoresist layer thickness change before and after solvent stripping test was 90 Å. Similarly three other resist wafers post-apply baked at 150° C., 160° C. and 170° C. respectively then went through solvent stripping test. The resulting thickness changes were 86 Å, 66 Å, and 50 Å respectively.

Example 2

Layer Loss Test with its Own Casting Solvent of Photoresist Formulation B after Various Post-Exposure Bake Temperatures A terpolymer consisting of 37 mole % MAdMA, 17 mole % HAdMA and 43 mole % NLM was dissolved in PGMEA with 30 wt % GBL, 7 wt % BPI—N and 0.59 wt % of tert-butyl 2-phenyl-1,3-benzodiazole-1-carboxylate (all wt % relative to polymer) to make a photoresist formulation B with 6.6 wt % of solid content. The photoresist formulation was filtered through a 0.2 μm filter. The photoresist formulation was spin coated on a 5" silicon wafer. The resulting photoresist layer was post-apply baked at 140° C. for 60 seconds. The thickness of the photoresist layer was then measured with a NanoSpec 8000 Layer Thickness Analyzer from Nanometrics Incorporated. The casting solvent was dispensed on the above mentioned wafer and spun at 1500 rpm for 60 s, then baked at 130° C. for 60 seconds. The photoresist layer thickness was then measured again with a Nanospec 8000 Layer Thickness Analyzer. The photoresist layer thickness change before and after solvent stripping test was 111 Å. Similarly three other resist wafers post-apply bake at 150° C., 160° C. and 170° C. respectively then went through solvent stripping test. The resulting thickness changes were 105 Å, 75 Å and 45 Å respectively.

Example 3

Layer Loss Test with its Own Casting Solvent of Photoresist Formulation C after Various Post-Exposure Bake Temperatures A terpolymer consisting of 37 mole % MAdMA, 6 mole % HAdMA and 57 mole % NLM was dissolved in 70/30 wt % PGMEA/cyclohexanone co-solvent with 7 wt % BPI—N and 0.59 wt % of tert-butyl 2-phenyl-1,3-benzodiazole-1-carboxylate (all wt % relative to polymer) to make a photoresist formulation C with 6.6 wt % of solid content. The photoresist formulation was filtered through a 0.2 μm filter. The resist was spin coated on a 5" silicon wafer. The resist was post-apply baked at 140° C. for 60 seconds. The thickness of the polymer layer was then measured with a NanoSpec 8000 Layer Thickness Analyzer from Nanometrics Incorporated. The casting solvent was dispensed on the above mentioned wafer and spun at 1500 rpm for 60 s, then baked at 130° C. for 60 seconds. The photoresist layer thickness was then measured again with a Nanospec 8000 Layer Thickness Analyzer. The photoresist layer thickness change before and after solvent stripping test was 117 Å. Similarly three other resist wafers post-apply baked at 150° C., 160° C. and 170° C. respectively then went through solvent stripping test. The resulting thickness changes were 73 Å, 70 Å and 34 Å respectively.

Example 4

Lithographic Evaluation of Photoresist Formulation D Through Post-Develop Bake and Double Exposure Steps

A terpolymer consisting of 37 mole % MAdMA, 17 mole % HAdMA and 43 mole % NLM was dissolved in PGMEA with 30 wt % GBL, 7 wt % BPI—N and 0.53 wt % of tert-butyl 2-phenyl-1,3-benzodiazole-1-carboxylate (all wt % relative to polymer) to make a photoresist formulation D with 6.6 wt % of solid content. The photoresist formulation was filtered through a 0.2 μm filter. The photoresist layer was spin coated on a 12" silicon wafer, which had a 42 nm thickness coating of Rohm Hass AR40A. The photoresist layer was post-apply baked at 130° C. for 60 seconds and exposed to 193 nm wavelength light on an ASML stepper (0.7 NA, 0.82 outer σ 0.32 inner σ annular illumination). The wafer was then post-exposure baked at 125° C. for 60 seconds. The wafer was developed using a single puddle develop process for 30 seconds with 0.263 N TMAH developer (Moses Lake's AD-10). The wafer was then post-develop baked at 200° C. for 90 seconds.

A JSR photoresist AM2073 was then spin coated on the above mentioned wafer. The photoresist was post-apply baked at 110° C. for 60 seconds and exposed to 193 nm wavelength light on an ASML stepper (0.7 NA, 0.82 outer σ 0.32 inner σ annular illumination). The wafer was then post-exposure baked at 120° C. for 60 seconds. The wafer was developed using a single puddle develop process for 30 seconds with 0.263 N TMAH developer (Moses Lake's AD-10). Under these process conditions, no substantial intermixing of photoresist layers was observed. Visually sharp images in the top and bottom photoresist layers were observed.

The repeat units used in resist formulation examples supra are:

-continued

NLM.

Thus, the embodiments of the present invention provide photoresist compositions and process using these photoresist compositions in multiple exposure/multiple layer photoresist processes that overcome the limitations of the prior art due to the ability of first photoresist composition polymers to be thermally switched from being soluble to being substantially insoluble in its own casting solvent.

The description of the embodiments of the present invention is given above for the understanding of the present invention. It will be understood that the invention is not limited to the particular embodiments described herein, but is capable of various modifications, rearrangements and substitutions as will now become apparent to those skilled in the art without departing from the scope of the invention. Therefore, the following examples are provided to further describe the present invention. The invention is not limited to the details of the examples. Any modifications and changes known to the skilled in the art would be within the spirit and scope of the invention.

What is claimed is:

1. A method of forming patterned structure, said method comprising:
   (a) dispensing a chemically amplified positive photoresist formulation over a top surface of a substrate or a top surface of a fabrication layer formed on said substrate and removing a casting solvent by pre-exposure baking said photoresist formulation to form a photoresist layer, said photoresist formulation comprising a mixture of said casting solvent, a terpolymer or tetrapolymer dissolved in said casting solvent, and a photoacid generator;
   after (a), (b) patternwise exposing said photoresist layer to actinic radiation to form exposed photoresist layer;
   after (b), (c) developing said exposed photoresist layer in an aqueous base solution to selectively remove regions of said photoresist layer exposed to said actinic radiation to form a patterned photoresist layer;
   after (c), (d) post-develop baking said patterned photoresist layer at a temperature of about 150° C. or greater, after said post develop baking, said terpolymer or tetrapolymer being substantially insoluble in said casting solvent; and
   (e) forming a non photoresist layer over a top surface of said patterned photoresist layer and (i) regions of said top surface of said substrate or (ii) regions of a top surface of said fabrication layer where said substrate or layer is not covered by said patterned photoresist layer, said non photoresist layer comprising a second polymer.

2. A method of forming patterned structure, said method comprising:
   (a) dispensing a chemically amplified positive first photoresist formulation over a top surface of a substrate or a top surface of a fabrication layer formed on said substrate and removing a first casting solvent by pre-exposure baking said first photoresist formulation to form at first photoresist layer, said first photoresist formulation comprising a mixture of said first casting solvent, a first terpolymer or tetrapolymer dissolved in said first casting solvent, and a first photoacid generator;
   after (a), (b) patternwise exposing said first photoresist layer to first actinic radiation to form a first exposed photoresist layer;
   after (b), (c) developing said first exposed photoresist layer in a first aqueous base solution to selectively remove regions of said first photoresist layer exposed to said first actinic radiation to form a first patterned photoresist layer;
   after (c), (d) post-develop baking said first patterned photoresist layer to a temperature about 150° C. or greater, after said post-develop baking, said first terpolymer or tetrapolymer being substantially insoluble in said first casting solvent or a second casting solvent of a positive second photoresist formulation;
   after (d), (e) dispensing said positive second photoresist formulation over said patterned first photoresist layer, said second photoresist formulation comprising said second casting solvent, a second polymer dissolved in said second casting solvent, and a second photoacid generator, and removing said second casting solvent to form a second photoresist layer comprising said second polymer;
   after (e), (f) patternwise exposing said second photoresist layer to second actinic radiation to form a second exposed photoresist layer; and
   after (f), (g) placing said second exposed photoresist layer in a second aqueous base solution to selectively remove regions of said second exposed photoresist layer exposed to said second actinic radiation to form a second patterned photoresist layer.

3. The method of claim 2, further including:
   performing an ion implantation through said fabrication layer and into said substrate where said fabrication layer is not covered by said first or said second patterned photoresist layers.

4. The method of claim 2, further including:
   either (i) etching a pattern into said substrate where said substrate or said fabrication layer is not covered by said first or said second patterned photoresist layers, (ii) etching a pattern into said fabrication layer where said substrate or said fabrication layer is not covered by said first or said second patterned photoresist layers or (iii) etching through said fabrication layer and etching a pattern into said substrate where said substrate or said fabrication layer is not covered by said first or said second patterned photoresist layers.

5. The method of claim 2, wherein:
   said first patterned photoresist layer comprises first openings in a layer of said first polymer;
   said second patterned photoresist layer comprises second openings in a layer of said second polymer;
   a first at least one of said second openings aligned over a selected first opening of said first openings to expose said substrate or said fabrication layer in a common bottom of said selected first opening and said first at least one of said second openings; and
   a second at least one of said second openings not aligned over any first opening of said first openings to expose said first polymer layer in a bottom of said second at least one of said second openings.

6. The method of claim 2, further including:
said pre-exposure baking not cross-linking said first terpolymer or tetrapolymer; and
said post-develop baking cross-linking said first terpolymer or said tetrapolymer.

7. The method of claim 2, wherein said first terpolymer or tetrapolymer includes a repeat unit having a hydroxyl moiety.

8. The method of claim 7, wherein said hydroxyl moiety is selected from the group consisting of primary alcohol groups, secondary alcohol groups and tertiary alcohol groups.

9. The method of claim 2, wherein a backbone of said first terpolymer or tetrapolymer does not include unsaturated carbon-to-carbon bonds.

10. The method of claim 2, said first terpolymer or tetrapolymer including a repeat unit having a tertiary ester moiety, said tertiary ester moiety selected from the group consisting of esters of methyladamantane, ethyladamantane, methylcyclopentane, ethylcyclopentane, methylcyohexane, ethylcyclohexane, methylcycloheptane, ethylcyclohepatane, methylcyclooctane, ethylcyclooctane, and t-butyl groups.

11. The method of claim 2, said first terpolymer or tetrapolymer including a repeat unit having a lactone moiety.

12. The method of claim 11, said first terpolymer or tetrapolymer including a repeat unit having a moiety selected from the group consisting of sulfonamides, fluorinated sulfonamides, fluoroalcohols, dicarboxyimides, N-hydroxy dicarboxyimides, phenol, amino and imino groups.

13. The method of claim 2, wherein said first terpolymer or tetrapolymer comprises the repeat units 14. The method of claim 2, wherein said first terpolymer includes first repeat units having a tertiary hydroxyl moiety, second repeat units having a lactone moiety, and third repeat units having a tertiary ester moiety.

15. The method of claim 2, wherein said first tetrapolymer includes first repeat units having a tertiary hydroxyl moiety, second repeat units having a lactone moiety, third repeat units having a tertiary ester moiety, and fourth repeat units having a solubility promoting moiety containing fluorine atoms.

16. The method of claim 2, further including:
between (b) and (c), post-exposure baking said first patterned photoresist layer.

17. The method of claim 2, wherein said second photoresist layer has a greater sensitivity to said second actinic radiation than said first photoresist layer.

18. The method of claim 2, wherein said first terpolymer or tetrapolymer and said second polymer are a same polymer.

19. The method of claim 2, further including:
after (g), (h) etching trenches into said substrate or said fabrication level where said fabrication level is not protected by said first or second patterned photoresist layers.

20. The method of claim 1, wherein said terpolymer comprises the repeat units

21. The method of claim 1, wherein said terpolymer or tetrapolymer includes first repeat units having a tertiary hydroxyl moiety, second repeat units having a lactone moiety, and third repeat units having a tertiary ester moiety.

22. The method of claim 21, wherein said terpolymer or tetrapolymer includes fourth repeat units having a solubility promoting moiety containing fluorine atoms.

23. The method of claim 1, further including:
between (b) and (c), post-exposure baking said first patterned photoresist layer.

24. The method of claim 1, further including:
after (e), (g) etching trenches into said substrate or said fabrication level where said fabrication level is not protected by said first or second patterned photoresist layers.

25. The method of claim 1, further including:
said pre-exposure baking not cross-linking said terpolymer or tetrapolymer; and
said post-develop baking cross-linking said terpolymer or tetrapolymer.

26. The method of claim 1, wherein said terpolymer includes first repeat units having a tertiary hydroxyl moiety, second repeat units having a lactone moiety, and third repeat units having a tertiary ester moiety.

27. The method of claim 1, wherein said tetrapolymer includes first repeat units having a tertiary hydroxyl moiety, second repeat units having a lactone moiety, third repeat units having a tertiary ester moiety, and fourth repeat units having a solubility promoting moiety containing fluorine atoms.

* * * * *